US006967177B1

(12) United States Patent
May et al.

(10) Patent No.: US 6,967,177 B1
(45) Date of Patent: Nov. 22, 2005

(54) TEMPERATURE CONTROL SYSTEM

(75) Inventors: Charles E. May, Gresham, OR (US); Hemanshu D. Bhatt, Troutdale, OR (US)

(73) Assignee: LSI Logic Corporation, Milpitas, CA (US)

( * ) Notice: Subject to any disclaimer, the term of this patent is extended or adjusted under 35 U.S.C. 154(b) by 96 days.

(21) Appl. No.: 09/670,975

(22) Filed: Sep. 27, 2000

(51) Int. Cl.$^7$ .......................... H01L 21/26; H01L 21/42; H01L 21/324; H01L 21/477; B05C 11/00
(52) U.S. Cl. ........................... 438/798; 438/5; 438/795; 118/666; 432/81
(58) Field of Search ................................ 438/798, 799, 438/795, 5; 118/666; 432/81

(56) References Cited

U.S. PATENT DOCUMENTS

| | | | | |
|---|---|---|---|---|
| 5,200,023 A | * | 4/1993 | Gifford et al. ................ | 216/59 |
| 5,435,379 A | * | 7/1995 | Moslehi et al. ............. | 165/80.4 |
| 5,478,429 A | * | 12/1995 | Komino et al. ......... | 156/345.44 |
| 5,508,934 A | * | 4/1996 | Moslehi et al. ............. | 700/121 |
| 5,584,971 A | * | 12/1996 | Komino ................. | 204/192.13 |
| 5,591,269 A | * | 1/1997 | Arami et al. ............ | 118/723 R |
| 5,605,600 A | * | 2/1997 | Muller et al. ................ | 438/695 |
| 6,081,414 A | * | 6/2000 | Flanigan et al. ............. | 361/234 |
| 6,583,638 B2 | * | 6/2003 | Costello et al. ............. | 324/760 |

* cited by examiner

Primary Examiner—Erik Kielin
(74) Attorney, Agent, or Firm—Luedeka, Neely & Graham, P.C.

(57) ABSTRACT

An apparatus for controlling the substrate temperature of a substrate during processing of the substrate at a process energy. A chuck temperature input receives temperature measurements from temperature sensors at a substrate chuck, and a temperature set point input receives temperature set points. The temperature set points define a range of temperatures within which the apparatus maintains the substrate temperature. A chuck temperature controller output sends control signals to a chuck temperature controller, which signals are operable to selectively increase and decrease the chuck temperature. A process energy output sends control signals that are operable to selectively increase and decrease the process energy during the processing of the substrate. A controller compares the temperature measurements received from the temperature sensors at the substrate chuck through the chuck temperature input to the temperature set points received through the temperature set point input. The controller sends control signals through the chuck temperature controller output to the chuck temperature controller to selectively decrease the chuck temperature when the temperature measurements received from the temperature sensors at the substrate chuck are above the temperature set points. The controller further sends control signals through the process energy output to selectively decrease the process energy when the temperature measurements received from the temperature sensors at the substrate chuck are above the temperature set point. Preferably, the controller first sends control signals through the chuck temperature controller output to control the chuck temperature, and only sends control signals through the process energy output when the chuck temperature cannot be sufficiently controlled by the chuck temperature controller.

7 Claims, 2 Drawing Sheets

TEMPERATURE CONTROL SYSTEM

FIELD

This invention relates to the field of substrate temperature control. More particularly the invention relates to controlling the temperature of a chuck that is used in substrate processes that create heat.

BACKGROUND

There are several reasons why it is important to control the amount of thermal energy that a substrate receives during semiconductor device processing. For example, some of the structures that are formed at the various stages of processing are sensitive to thermal energy and tend to change over time as thermal energy is absorbed by the substrate. Further, many fabrication processes are sensitive to thermal energy and tend to produce varying results as the thermal energy absorbed by the substrate changes. Thus, if the amount of thermal energy absorbed by the substrate is not controlled, processes tend to produce unexpected or undesired results, and structures that are initially properly formed tend to degrade toward unexpected or undesired forms. Therefore, it is important to control the amount of thermal energy that the substrate receives during processing.

The amount of thermal energy absorbed by the substrate can be controlled in at least two different ways. First, the temperature at which the substrate is maintained can be controlled. For example, even if the substrate is in a hot environment, the substrate itself can be cooled so that the bulk of the substrate does not experience anything more than a given temperature. Second, the length of time at which the substrate is exposed to a given temperature can be controlled. By controlling these two parameters the amount of thermal energy absorbed by the substrate during processing can be controlled.

Unfortunately, it is difficult to control the temperature of the substrate during processing. Temperature conditions experienced by the substrate in some processes tend to vary according to one or more of a number of different parameters, such as position on the substrate, length of processing time, and processing energy. Traditional substrate temperature control systems tend to be ineffectual in controlling the temperature of the substrate when faced with the interactions between one or more of these and other thermal energy parameters.

What is needed, therefore, is a system for controlling the temperature of a substrate during processing that accounts for temperature variation parameters such as position, time, and energy.

SUMMARY

The above and other needs are met by a method for controlling the temperature of a substrate during processing of the substrate at a process energy, by controlling the temperature of the chuck on which the substrate resides during the processing. A thermal transfer media is circulated at a thermal transfer media temperature through the substrate chuck to adjust both the chuck temperature and the substrate temperature. The thermal transfer media is circulating at a flow rate. The chuck temperature is sensed from at least one chuck temperature sensing location at the chuck, and the sensed chuck temperature is reported to a controller. The controller is operable to adjust the process energy and at least one of the thermal transfer media flow rate and the thermal transfer media temperature. When the sensed chuck temperature is outside of the desired temperature range, then the controller is used to adjust at least one of the thermal transfer media flow rate, the thermal transfer media temperature, and the process energy to bring the sensed chuck temperature within the desired temperature range.

One of the benefits of the method given above is that the controller is operable to not only control at least one of the thermal transfer media flow and the thermal transfer media temperature, but the controller is additionally operable to control the process energy. In this manner, the controller is operable to, for example, decrease the process energy to cool the substrate chuck and the substrate during processing. This may be especially important when processing conditions are such that the adjustment of the thermal transfer media flow and the thermal transfer media temperature are insufficient to adequately control the chuck temperature and the substrate temperature within the desired temperature range.

In various preferred embodiments of the invention, the chuck temperature is sensed from three different locations at the chuck, which locations may be either within the chuck or on the surface of the chuck that is disposed adjacent the substrate. The desired temperature range at which the sensed chuck temperature is controlled is between about fifty centigrade and about five hundred centigrade, and most preferably at about 280 centigrade. In a most preferred embodiment, the controller first attempts to bring the sensed temperature within the desired temperature range by adjusting at least one of the thermal transfer media temperature and the thermal transfer media flow rate. When adjusting at least one of the thermal transfer media temperature and the thermal transfer media flow rate cannot bring the sensed temperature within the desired temperature range, then the controller preferably controls the sensed temperature by additionally adjusting the process energy.

In another embodiment of the invention, an apparatus is provided for controlling the substrate temperature of a substrate during processing of the substrate at a process energy. A chuck temperature input receives temperature measurements from temperature sensors at a substrate chuck, and a temperature set point input receives temperature set points. The temperature set points define a range of temperatures within which the apparatus maintains the substrate temperature. A chuck temperature controller output sends control signals to a chuck temperature controller, which signals are operable to selectively increase and decrease the chuck temperature. A process energy output sends control signals that are operable to selectively increase and decrease the process energy during the processing of the substrate.

A controller compares the temperature measurements received from the temperature sensors at the substrate chuck through the chuck temperature input to the temperature set points received through the temperature set point input. The controller sends control signals through the chuck temperature controller output to the chuck temperature controller to selectively decrease the chuck temperature when the temperature measurements received from the temperature sensors at the substrate chuck are above the temperature set points. The controller further sends control signals through the process energy output to selectively decrease the process energy when the temperature measurements received from the temperature sensors at the substrate chuck are above the temperature set point. Preferably, the controller first sends control signals through the chuck temperature controller output to control the chuck temperature, and only sends control signals through the process energy output when the chuck temperature cannot be sufficiently controlled by the chuck temperature controller.

As described above, one of the benefits of the apparatus given above is that when processing conditions are such that the adjustment of thermal transfer media flow and thermal transfer media temperature are insufficient to adequately control the chuck temperature and the substrate temperature within the desired temperature range, the apparatus is operable to further control the chuck temperature and the substrate temperature by adjusting the process energy.

BRIEF DESCRIPTION OF THE DRAWINGS

Further advantages of the invention are apparent by reference to the detailed description when considered in conjunction with the following figures, which are not to scale so as to more clearly show the details, wherein like reference numbers refer to like elements within the several views, and wherein.

DETAILED DESCRIPTION

Figure 1:
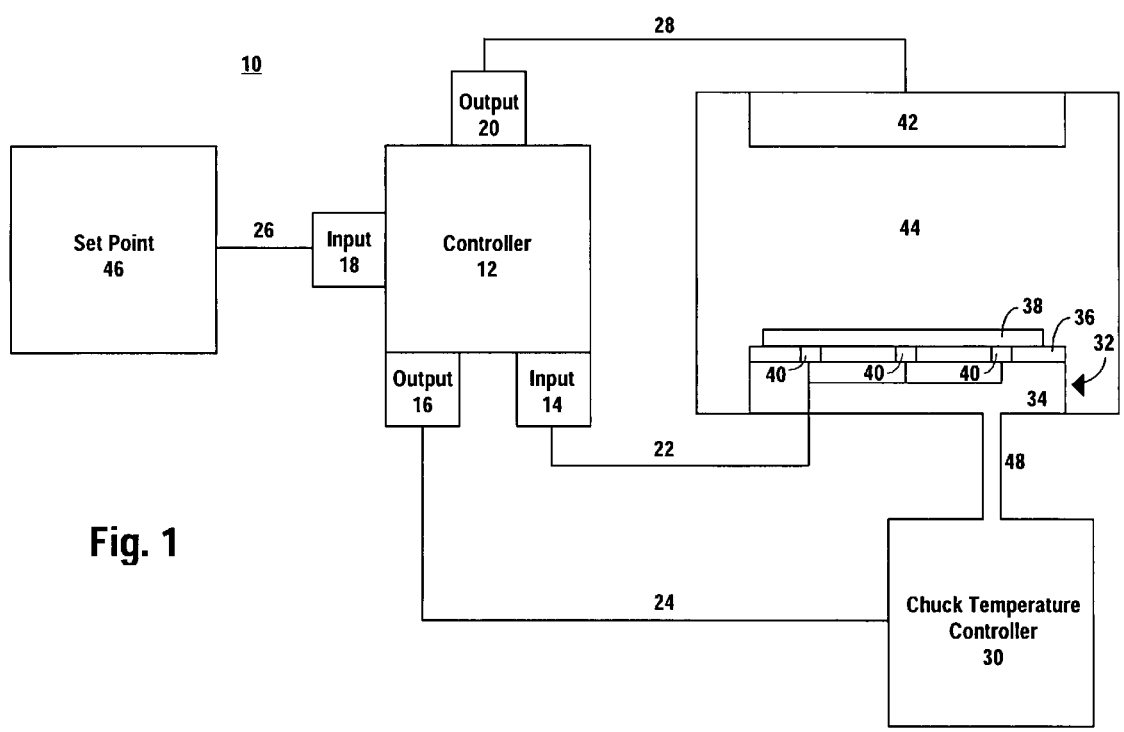
FIG. 1 is a functional block diagram of temperature control system according to the present invention.

Referring now to FIG. 1, there is depicted an embodiment of a temperature control system apparatus 10 according to the present invention. The temperature control system 10 works cooperatively with a reaction chamber 44, such as a high density plasma deposition chamber or an ion bombardment chamber such as a high energy etcher. Processes that are conducted in chambers 44 such as those described tend to impart a relatively high amount of energy to the substrates 38 processed in the chamber 44, which tends to be absorbed by the substrate 38 as thermal energy. As mentioned above, controlling the amount and residence time of the thermal energy absorbed by a substrate 38 tends to have an impact on the both the results of the process conducted within the chamber 44 and the integrity of the previously formed structures on the substrate 38.

In a typical configuration of the chamber 44, the energy for the process is emitted from some type of emitter 42, which may be a device such as a sputter target. The substrate 38 preferably resides upon some type of substrate holder or chuck 32 during processing in the chamber 44. The chuck 32 has a surface 36 atop of which the substrate 38 is received by the chuck 32. The surface 36 provides an interface between the substrate 28 and the other elements of the chuck 32, as explained in greater detail hereafter. Most preferably, the surface 36 is designed and manufactured in consideration with specifically identified heat transfer properties, also as explained in greater detail hereafter.

The temperature of the surface 36 of the chuck 32 is sensed by thermal sensors 40. In practice, there may be one or many thermal sensors 40 disposed within the chuck 32. If the process conducted within the chamber 44 is such that the substrate 38 and the chuck 32 absorb thermal energy with a very uniform profile across the surface 36 of the chuck 32, then there may be no need for more than one thermal sensor 40 to be present in the chuck 32. However, more often than not the thermal energy profile across the surface 36 of the chuck 32 and also across the substrate 38 is not very uniform, and therefore in the preferred embodiment a number of thermal sensors 40 are used, such as the three thermal sensors 40 depicted. In general, the less uniform the thermal energy profile across the surface 36 of the chuck 32, the more thermal sensors 40 are preferably used to sense the temperature of the substrate 38 at the surface 36 of the chuck 32. Conversely, the more uniform the thermal energy profile across the surface 36 of the chuck 32, the fewer thermal sensors 40 are preferably used to sense the temperature of the substrate 38 at the surface 36 of the chuck 32.

The thermal sensors 40 are devices of a type that is compatible with the operation of the chuck 32, the environment within the reactor 44, and the other materials used in the formation of the chuck 32. For example, the thermal sensors 40 are thermocouples in one embodiment and resistance temperature devices in another embodiment. Alternately, combinations of these types of devices and other types of devices are used to exploit the specific benefits of the different kinds of devices, based upon the specific configuration of the chuck 32 and the processes to be performed within the reaction chamber 44.

The thermal sensors 40 may be located in one or more different positions relative to the surface 36 of the chuck 32. For example, the thermal sensors 40 may be located at a position such that they are very near the upper surface of the surface 36 of the chuck 32, such that they are in contact with, or very nearly in contact with the back side of the substrate 38 that resides on the surface 36 of the chuck 32. In this manner, the thermal sensors 40 tend to be more responsive to the thermal conditions within the substrate 38. Conversely, the thermal sensors 40 may be underneath the surface 36 of the chuck 32, at a position that is substantially inside of the chuck 32. In this position, the thermal sensors 40 tend to be somewhat less responsive to the thermal conditions within the substrate 38, and somewhat more responsive to the overall temperature within the chuck 32. In a most preferred embodiment, the thermal sensors 40 are at a position where they either make contact with the back side of the substrate 38 or very nearly make contact with the back side of the substrate 38. However, in other embodiments, the processing conditions within the reactor 44 may dictate that the type of thermal sensor 40 selected is better placed at an alternate location within the chuck 32.

The chuck 32 preferably has a reservoir 34, within which a thermal transfer media such as a coolant is circulated. Although the reservoir 34 is shown as a single open reservoir 34 in the embodiment depicted in FIG. 1, it is appreciated that this specific embodiment of the reservoir 34 is for illustration only, and that in actual construction of the chuck 32, the reservoir 34 is preferably multi-chambered so as to more specifically control the characteristics of the heat transfer between the surface 36 of the chuck 32 and the thermal transfer media circulating within the reservoir 34.

For example, if the purpose of the thermal transfer media is to cool the surface 36 of the chuck 32, and to thereby cool the substrate 38, then the thermal transfer media is preferably a coolant. Further, the reservoir 34 of the chuck 32 is in this example preferably channeled so that the flow of the coolant through the reservoir 34 tends to remove thermal energy from the surface 36 of the chuck 32 in a uniform manner, so that the temperature at the surface 36 of the chuck 32, such as measured by the thermal sensors 40, tends to likewise be relatively uniform. In one preferred embodiment, the flow rate and temperature of the thermal transfer media through the different channels of the reservoir 34 are all independently variable so as to more fully provide for a uniform thermal energy profile across the surface 36 of the chuck 32. In this manner, the temperature of the substrate 38 residing atop the surface 36 of the chuck 32 is also maintained at a relatively uniform temperature.

In a most preferred embodiment the thermal transfer media is delivered to the reservoir 34 of the chuck 32 by a flow means 48, such as a tubing like a stainless steel pipe or a polyvinyl chloride tubing. The flow means 48 receives the thermal transfer media from a chuck temperature controller 30, such as a temperature controlled bath of the thermal transfer media. For example, the thermal transfer media is in one embodiment a fluid such as water or a mixture of ethylene glycol and water that flows from a temperature controlled bath in the chuck temperature controller 30 through the flow means 48 to the reservoir 34 of the chuck 32, and then back through the flow means 48 and into the temperature controlled bath in the chuck temperature controller 30. Once back in the temperature controlled bath of the chuck temperature controller 30, the thermal transfer media is conditioned to either remove the thermal energy that it has absorbed from the surface 36 of the chuck 32 or to receive thermal energy to replace that which it has transferred to the surface 36 of the chuck 32, depending upon the specific purpose of the thermal transfer media.

In alternate embodiments of the temperature control system 10 according to the invention where additional thermal energy is to be added to the surface 36 of the chuck 32 and thereby to the substrate 38, the chuck 32 may include a heater block, such as an electrical heater block that delivers thermal energy to the substrate 38 in a manner as controlled as described in more detail below.

In a preferred embodiment of a temperature control system 10 according to the invention, a controller 12 controls the amount of thermal energy imparted to the substrate 38 and the residence time of that thermal energy within the substrate 38. Control of these parameters tends to influence the temperature experienced by the substrate 38 during processing within the reactor 44, as measured by the thermal sensors 40. To accomplish these design objectives, the controller 12 is in communication with other elements as described herein.

The emitter 42 is preferably electrically connected to the controller 12 by a means 28 through a process energy output 20. In the preferred embodiment, the controller 12 does not provide the actual power used to energize the emitter 42, but is able to control the amount of power delivered to the emitter 42. For example, in the embodiment where the emitter 42 is a target that is used in a high density plasma deposition reactor, the controller 12 is preferably connected via the process energy output 20 and the means 28 to the power supply from which the target 42 draws its energy or to the dedicated controller that directly controls the amount of power delivered to the emitter 42. In the example of the high density plasma deposition reactor, by varying the power delivered to the emitter 42 the controller 12 essentially controls the deposition rate of the process conducted within the reactor 44.

The controller 12 is also preferably in communication with the thermal sensors 40 via means 22 through a chuck temperature input 14. In this manner the controller 12 receives signals indicating the temperature sensed by each of the thermal sensors 40 at a point in time at which the signals are generated by the thermal sensors 40. Additionally, the controller 12 is preferably in communication with the chuck temperature controller 30 via communication means 24 through a chuck temperature controller output 16. Again, in a most preferred embodiment, it is not the controller 12 that is used to directly provide for circulation and thermal management of the thermal transfer media, but rather the controller 12 operates to control the thermal management of the thermal transfer media through the means of the chuck temperature controller 30, as described above. In a most preferred embodiment, the chuck temperature controller 30 is operable to both regulate the temperature of the thermal transfer media and the flow rate of the thermal transfer media.

Further, the controller 12 is operable to receive a temperature set point from a set point input 46 through communication means 26 and temperature set point input 18. In this manner the controller 12 receives a set point temperature that it compares to the chuck temperature received through the chuck temperature input 14. If the chuck temperature is higher than the set point temperature, then the controller 12 sends signals through the output 20 and the output 16 to exert influence on the amount of thermal energy delivered to the substrate 38 and the residence time of that thermal energy within the substrate 38, by attempting to either decrease the amount of thermal energy delivered to the substrate 38 or decrease the residence time of the thermal energy within the substrate 38, or both. On the other hand, if the chuck temperature is lower than the set point temperature, then the controller 12 sends signals through the output 20 and the output 16 to exert influence on the amount of thermal energy delivered to the substrate 38 and the residence time of that thermal energy within the substrate 38, by attempting to either increase the amount of thermal energy delivered to the substrate 38 or increase the residence time of the thermal energy within the substrate 38, or both.

In a most preferred embodiment, the controller 12 first attempts to reconcile the set point temperature with the chuck temperature by exerting influence on the residence time of the thermal energy in the substrate by adjusting the chuck temperature controller 30. Preferably this is accomplished by adjusting either the temperature of the thermal transfer media or the flow rate of the thermal transfer media or both. In this manner, the residence time of the thermal energy absorbed by the substrate 38 in the reactor 44 is adjusted, and the temperature of the substrate 38 is similarly influenced.

For example, if the chuck temperature indicates that the substrate temperature is higher than desired in comparison to the set point temperature, then the controller 12 is operable to send signals to the chuck temperature controller 30 calling for a higher flow rate of coolant, which tends to remove thermal energy from the chuck 32 and the substrate 38 at a faster rate. Further, the controller 12 may alternately send signals to the chuck temperature controller 30 calling for a reduction in the temperature of the coolant, which also tends to remove thermal energy from the chuck 32 and the substrate 38 at a faster rate. Both of these two control mechanisms, either alone or in combination, tend to reduce the residence time of the thermal energy within the substrate 36, and thereby reduce the temperature of the substrate 38.

In a preferred embodiment, sending such control signals from the controller 12 to the chuck temperature controller 30 is sufficient to control the temperature of the substrate 38. However, in some processes, most notably a high density plasma deposition process, such measures may be insufficient to adequately control the temperature of the substrate 38. In such situations, the controller is additionally operable to adjust the amount of energy delivered by the emitter 42 to the substrate 38 during processing in the reactor 44.

Thus, when controlling the residence time of the thermal energy within the substrate 38 is insufficient to control the temperature within the substrate 38, the controller 12 reduces the amount of energy delivered to the substrate 38 by the emitter 42 and thereby influences the temperature of the substrate 38. In a most preferred embodiment, the controller 12 first acts to control the temperature of the substrate 38 by use of the chuck temperature controller 30, and then only when that means is insufficient to adequately control the temperature of the substrate 38, the controller 12 next acts to control the temperature of the substrate 38 via the means of reducing the energy output of the emitter 42. In a preferred embodiment, the temperature of the substrate 38 is held between about fifty centigrade and about five hundred centigrade, and most preferably at about 280 centigrade.

Figure 2:
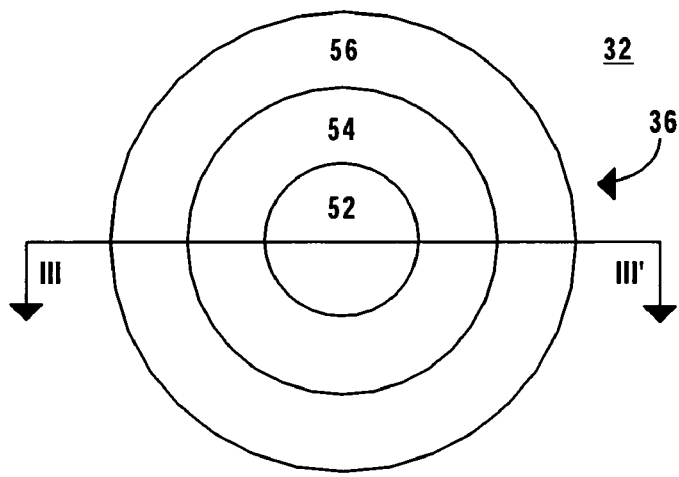
FIG. 2 is a top plan view of a substrate chuck according to the present invention.

In addition to the means described above, further means can be employed to exert additional control over the thermal profile of the substrate 38 and the surface 36 of the chuck 32. Such further means are shown in FIG. 2, which depicts a surface 36 of a chuck 32 that has thermal conduction zones 52, 54, and 56. Although FIG. 2 depicts a surface 36 having three thermal conduction zones 52, 54, and 56, it is appreciated that this is by way of illustration only. While in the preferred embodiment the surface 36 of the chuck 32 has at least two different thermal conduction zones, in various embodiments the surface 36 of the chuck 32 has more than three thermal conduction zones. The selection of the number of thermal conduction zones depends upon the proper balance of several criteria, such as tolerance of the structures on the substrate 38 to a nonuniform thermal profile, tolerance of the process to a nonuniform thermal profile, amount of thermal energy delivered to the substrate 38, and the uniformity of the thermal energy delivered to the substrate 38.

Figure 3A:
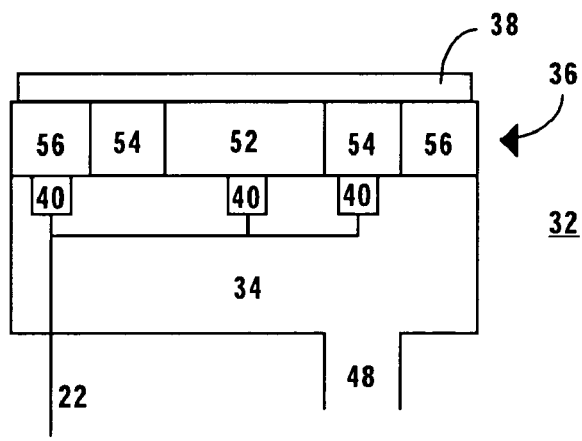
FIG. 3A is a cross sectional view of a first embodiment of the substrate chuck of FIG. 2.
Figure 3B:
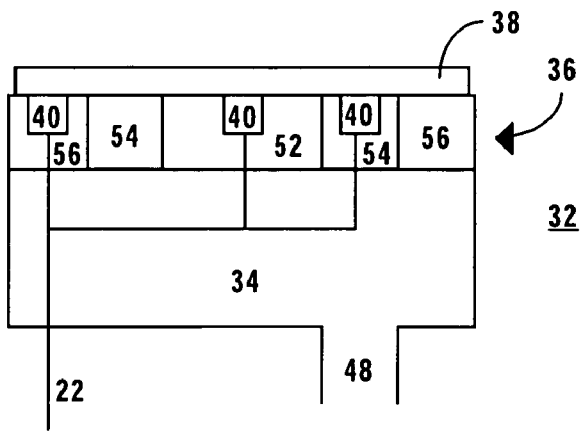
FIG. 3B is a cross sectional view of a second embodiment of the substrate chuck of FIG. 2.

The different thermal conduction zones 52, 54, and 56 of the surface 36 of the chuck 32 each have differing thermal conductivities and thereby are able to conduct thermal energy from the substrate 38 and to the heat sink 34 of the chuck 32 at varying rates. As depicted in FIGS. 3A and 3B, the heat sink 34 is a reservoir 34 that receives a thermal transfer media as described above. However, in this embodiment as presently explained the heat sink 34 may be of a type other than a circulated thermal transfer media. For example, the heat sink 34 may be fins that dissipate heat to the ambient environment or the heat sink 34 may be a thermal mass, such as a mathematically infinite thermal mass, given the constraints of a specific reactor 44 and process.

Further, in some embodiments, the thermal conduction zone 52, for example, has the same thermal conductivity as the thermal conduction zone 56, both of which have a difference thermal conductivity as compared to the intervening thermal conduction zone 54. Thus, the thermal conductivity of each of the various thermal conduction zones of the surface 36 of the chuck 32 is selected according to the anticipated thermal energy absorption of the substrate 38 at a location above or near the specific thermal conduction zone in question. In general, processes tend to develop greater heat near either the center of the substrate 38 or near the edges of the substrate 38. Thus, in a most preferred embodiment, the thermal conductivity of the thermal conduction zones 53, 54, and 56 is selected for the anticipated type of process.

For example, if the anticipated process is of the type that tends to deliver a greater amount of thermal energy to the center of the substrate 38, and it is further desired to remove thermal energy from the substrate 38 and thus reduce the temperature of the substrate 38, then the thermal conductivity of the center most thermal conduction zone 52 is preferably higher than the thermal conductivity of the middle thermal conduction zone 54, which preferably has a thermal conductivity that is higher than the thermal conductivity of the outermost thermal conduction zone 56. By selecting the thermal conductivity of the various thermal conduction zones 52, 54, and 56 in this manner, the thermal energy is drawn off at a faster rate from the center of the substrate 38 where the greatest amount of thermal energy is delivered, and the thermal energy is drawn off at a slower rate from the edges of the substrate 38 where the least amount of thermal energy is delivered. According, the thermal energy is drawn off at an intermediate rate from the portions of the substrate 38 that reside between the center portion of the substrate 38 and the edges of the substrate 38, which portions receive an intermediate amount of thermal energy during processing in the reactor 44.

Because varying levels of thermal energy are delivered to the substrate 38 and the thermal energy is likewise drawn off from the substrate 38 at varying levels that are preferably selected to match or substantially match the anticipated rates at which thermal energy is delivered to the substrate 38 at the various positions on the substrate 38, the thermal profile across the surface of the substrate 38 is maintained at a more uniform level. This tends to make control of the temperature of the substrate 38 by the controller 12 much easier to accomplish, as the controller tends to receive temperature measurements from the thermal sensors 40 that are more uniform. FIG. 3A depicts an embodiment in which the thermal sensors 40 are disposed underneath at least a portion of the surface 36 of the chuck 32, and FIG. 3B depicts an embodiment in which the thermal sensors 40 are disposed at the top surface of the surface 36 of the chuck 32, and are in intimate contact with the back side of the substrate 38.

The surface 36 of the chuck 32 is preferably formed of ceramics such as silicon nitride, silicon oxide, or most preferably aluminum oxide. The thermal conductivity of the ceramic is adjusted by blending into the ceramic during formation of the surface 36 varying amounts of a filler material that has either a higher or a lower thermal conductivity than the other material that is used to form the surface 36, such as the ceramic material. In a most preferred embodiment, the filler material has a higher thermal conductivity than the ceramic that is used to form the rest of the surface 36. Thus, areas of the surface 36 that are to have higher thermal conductivity receive a greater amount of the filler material during formation of the surface 36, and areas of the surface 36 that are to have lower thermal conductivity receive a lesser amount of the filler material during formation of the surface 36.

The material used for the filler in the formation of the surface 36 of the chuck 32 is selected so as to be compatible with the anticipated environment within the reactor 44, the anticipated temperatures developed during the processing cycles, and to not have any negative interactions with the substrate 38. The filler material is preferably a material such as beryllium oxide, silicon carbide, diamond, or most preferably aluminum nitride.

Although the shapes of the thermal conductivity zones 52, 54, and 56 as depicted in FIG. 2 are given as annular and circular regions, it is appreciated that these shapes as given are exemplary only and that in actual practice of the invention the shapes of the various thermal conductivity zones may be something other than circular and annular. For example, in an alternate embodiment, the thermal conductivity zones may be in the form of bands across the surface 36 of the chuck 32. Further, the thermal conductivity zones may be irregularly shaped, which irregular shapes are empirically determined by placing a number of thermal sensors 40 at various positions on top of a chuck 32, and measuring the thermal profile across the chuck 32. Thus, as suggested by this explanation, the shapes of the various thermal conductivity zones are preferably selected so as to create a relatively flat thermal profile across the surface 36 of the chuck 32, and thereby to impart a relatively flat thermal profile across the substrate 38.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for controlling a substrate temperature of a substrate during processing of the substrate at a process energy, by controlling with a controller a chuck temperature of a chuck on which the substrate resides during the processing, comprising:
    circulating under control of the controller a thermal transfer media at a thermal transfer media temperature through the substrate chuck to adjust both the chuck temperature and the substrate temperature, the thermal transfer media circulating at a flow rate,
    sensing the chuck temperature from at least one chuck temperature sensor in the chuck,
    reporting the sensed chuck temperature to the controller, where the controller is adapted to adjust the process energy, the thermal transfer media flow rate, and the thermal transfer media temperature, and
    when the sensed chuck temperature is outside of a desired temperature range, then using the controller to bring the sensed chuck temperature within the desired temperature range, by sequentially
        adjusting a first one of the thermal transfer media temperature and the thermal transfer media flow rate,
        checking the sensed chuck temperature to determine whether it is within the desired temperature range, and taking no further immediate action to control the substrate temperature if the sensed chuck temperature is within the desired temperature range,
        if the sensed chuck temperature is not within the desired temperature range after adjusting the one of the thermal transfer media temperature and the thermal transfer media flow rate, then adjusting a second one of the thermal transfer media temperature and the thermal transfer media flow rate that has not been previously adjusted,
        checking the sensed chuck temperature to determine whether it is within the desired temperature range, and taking no further immediate action to control the substrate temperature if the sensed chuck temperature is within the desired temperature range,
        if the sensed chuck temperature is not within the desired temperature range after adjusting both the thermal transfer media temperature and the thermal transfer media flow rate, then adjusting the process energy until the sensed chuck temperature is within the desired temperature range.

2. The method of claim 1 wherein the chuck temperature is sensed from three different sensors in the chuck.

3. The method of claim 1 wherein the chuck temperature sensor is disposed within the chuck.

4. The method of claim 1 wherein the chuck temperature sensor is disposed on a surface of the chuck adjacent the substrate.

5. The method of claim 1 wherein the desired temperature range is between about fifty centigrade and about five hundred centigrade.

6. The method of claim 1 wherein the controller adjusts the thermal transfer media flow rate prior to adjusting the thermal transfer media temperature.

7. The method of claim 1 wherein the controller adjusts the thermal transfer media flow rate after adjusting the thermal transfer media temperature.

* * * * *